US009688014B2

(12) United States Patent
Shimoda et al.

(10) Patent No.: US 9,688,014 B2
(45) Date of Patent: Jun. 27, 2017

(54) TRANSFERRING SYSTEM AND TRANSFERRING METHOD

(75) Inventors: Tatsuya Shimoda, Nomi (JP);
Mitsunori Kokubo, Numazu (JP); Yuki Sugiura, Mishima (JP)

(73) Assignee: TOSHIBA KIKAI KABUSHIKI KAISHA, Tokyo (JP)

( * ) Notice: Subject to any disclaimer, the term of this patent is extended or adjusted under 35 U.S.C. 154(b) by 590 days.

(21) Appl. No.: 13/820,078

(22) PCT Filed: Aug. 31, 2011

(86) PCT No.: PCT/JP2011/069752
§ 371 (c)(1),
(2), (4) Date: Jul. 12, 2013

(87) PCT Pub. No.: WO2012/029843
PCT Pub. Date: Mar. 8, 2012

(65) Prior Publication Data
US 2013/0285285 A1   Oct. 31, 2013

(30) Foreign Application Priority Data

Sep. 1, 2010   (JP) ................................. 2010-195677

(51) Int. Cl.
*B29C 35/08*   (2006.01)
*B29C 59/02*   (2006.01)
(Continued)

(52) U.S. Cl.
CPC ............ *B29C 59/026* (2013.01); *B82Y 10/00* (2013.01); *B82Y 40/00* (2013.01); *G03F 7/0002* (2013.01); *G11B 5/855* (2013.01); *G11B 7/263* (2013.01)

(58) Field of Classification Search
CPC .............................. B29C 59/026; G11B 7/263
See application file for complete search history.

(56) References Cited

U.S. PATENT DOCUMENTS

| 4,605,465 A * | 8/1986 | Morgan ...................... 156/273.3 |
| 2005/0056946 A1 * | 3/2005 | Gilleo ...................... H01L 24/81 |
| | | 257/783 |

(Continued)

FOREIGN PATENT DOCUMENTS

| JP | 9-106585 | 4/1997 |
| JP | 2001-058352 | 3/2001 |
| JP | 2005-153091 | 6/2005 |
| JP | 2007-019451 | 1/2007 |
| JP | 2008-194980 | 8/2008 |
| JP | 2010-040879 | 2/2010 |

OTHER PUBLICATIONS

International Search Report Issued in PCT/JP2011/069752 on Sep. 27, 2011.

(Continued)

*Primary Examiner* — Galen Hauth
(74) *Attorney, Agent, or Firm* — DLA Piper LLP US (57) ABSTRACT

A transfer system (1) for transferring a fine transfer pattern (M1) formed in a mold (M) to a to-be-molded material (D) provided on a substrate (W) includes a positioning device (3) configured to position the substrate (W) relative to the mold (M) and to bond the mold (M) and the substrate (W) together after the positioning, and a transfer device (5) provided separately from the positioning device (3) and configured to receive the mold (M) and the substrate (W) positioned and bonded together by the positioning device (3), and to cure the to-be-molded material (D) while pressing the mold (M) and the substrate (W) thereby to perform transfer.

10 Claims, 6 Drawing Sheets

(51) Int. Cl.
- *B82Y 10/00* (2011.01)
- *B82Y 40/00* (2011.01)
- *G03F 7/00* (2006.01)
- *G11B 5/855* (2006.01)
- *G11B 7/26* (2006.01)

(56) References Cited

U.S. PATENT DOCUMENTS

| | | |
|---|---|---|
| 2005/0116370 A1 | 6/2005 | Ogino |
| 2007/0155129 A1* | 7/2007 | Thallner ............ H01L 21/67092 438/455 |
| 2008/0213418 A1* | 9/2008 | Tan et al. ....................... 425/112 |
| 2009/0008379 A1* | 1/2009 | Ingemanson ................ 219/395 |
| 2009/0174118 A1 | 7/2009 | Maeda |
| 2010/0031833 A1 | 2/2010 | Kasumi |

OTHER PUBLICATIONS

English Language Abstract of JP 2005-153091 published Jun. 16, 2005.
English Language Translation of JP 2005-153091 published Jun. 16, 2005.
English Language Abstract of JP 2010-040879 published Feb. 18, 2010.
English Language Tranlsation of JP 2010-040879 published Feb. 18, 2010.
English Language Abstract JP 9-106585 publish Apr. 22, 1997.
English Language Translation JP 9-106585 publish Apr. 22, 1997.
English Language Abstract of JP 2001-058352 published Mar. 6, 2001.
English Language Translation of JP 2001-058352 published Mar. 6, 2001.
English Language Abstract of JP 2007-019451 published Jan. 25, 2007.
English Language Translation of JP 2007-019451 published Jan. 25, 2007.
Precision Engineering Journal of the International Societies for Precision Engineering and Nanotechnology 25(2001) 192-199.
English Language Abstract of JP 2008-194980 published Aug. 28, 2008.
English Language Translation of JP 2008-194980 published Aug. 28, 2008.

* cited by examiner

TRANSFERRING SYSTEM AND TRANSFERRING METHOD

CROSS REFERENCE TO RELATED APPLICATIONS

This application is a U.S. National Stage Application of International Application No. PCT/JP2011/069752 filed Aug. 31, 2011. International Application No. PCT/JP2011/069752 claims priority from Japan Patent Application No. 2010-195677 filed Sep. 1, 2010.

TECHNICAL FIELD

The present invention relates to a transfer system and a transfer method, or more specifically, to a technique to transfer a fine transfer pattern formed in a mold to a substrate.

BACKGROUND ART

A nanoimprint technique has been studied and developed in recent years. This technique is to produce a mold by forming a super fine transfer pattern in a quartz substrate or the like using electron beam lithography or the like and to transfer the transfer pattern that is formed in the mold to a to-be-molded material by pressing the mold against the to-be-molded material at a predetermined pressure (see NPL 1, for example).

Recently, in the field of a rotary storage device such as a hard disk, a CD, and a DVD, there has been a growing interest in methods applying the nanoimprint technique as means for molding a storage medium (recording medium) for forming high-density data into the disk.

In order to transfer a fine transfer pattern in a mold to an accurate position of a to-be-molded material on a substrate, a conventional transfer device for executing this imprint shoots an alignment mark on the mold and an alignment mark on the substrate with a camera through a substrate locator made of glass, for example, and positions the substrate (the substrate locator) relative to the mold on the basis of a shooting result. After the positioning process, the substrate located on the substrate locator is pressed with the mold, whereby the fine transfer pattern in the mold is transferred to the to-be-molded material on the substrate.

PTL 1, for example, can also be cited as literature related to the conventional technique.

CITATION LIST

Patent Literature

[PTL 1] Japanese Patent Application Publication No. 2008-194980

Non Patent Literature

[NPL 1] Precision Engineering Journal of the International Societies for Precision Engineering and Nanotechnology 25 (2001) 192-199

SUMMARY OF INVENTION

Technical Problem

Meanwhile, since performing both positioning of the substrate relative to the mold and pressing for transfer, the conventional transfer device has a problem that the accurate positioning is difficult in some cases or that limitation is imposed on the pressure applied in the transfer.

Specifically, if the substrate locator is made thicker so as to increase the pressure in the transfer, there is a risk of a failure to accurately measure an amount of displacement between the alignment marks on the mold and the substrate because the alignment marks have to be shot with the camera through the thick glass, for example.

On the other hand, thinning the substrate locator makes it possible to accurately measure the amount of displacement between the alignment marks with the camera. However, it is difficult to apply a large pressure in the transfer since the substrate locator has low rigidity.

The present invention has been made in view of the aforementioned problems and an object thereof is to provide a transfer system and a transfer method of transferring a fine transfer pattern formed in a mold to a to-be-molded material provided on a substrate, which are capable of accurately positioning the substrate relative to the mold and reducing time required for transfer by increasing a pressure in transfer.

Solution to Problem

A first aspect of the present invention is a transfer system configured to transfer a fine transfer pattern formed in a mold to a to-be-molded material provided on a substrate, comprising: a positioning device configured to position the substrate relative to the mold and to bond the mold and the substrate together after the positioning; and a transfer device provided separately from the positioning device and configured to receive the mold and the substrate positioned and bonded together by the positioning device, and to mold the to-be-molded material by pressing the mold and the substrate against each other thereby to perform the transfer.

A second aspect of the present invention is the transfer system according to the first aspect of the present invention, wherein the positioning device comprises heating means for heating the substrate and the mold, the transfer device comprises heating means being different from the heating means of the positioning device, and the heating means of the positioning device and the heating means of the transfer device is temperature-controllable on the basis of individual set values.

A third aspect of the present invention is the transfer system according to the first aspect of the present invention, wherein the to-be-molded material is a thermosetting resin, the positioning device comprises heating means for heating the substrate and the mold, the substrate and the mold are heated by using the heating means of the positioning device up to a temperature lower than a temperature to cure the thermosetting resin, and the substrate is positioned relative to the mold after the heating, the transfer device comprises heating means for heating the substrate and the mold bonded together, and the thermosetting resin is molded by using the heating means of the transfer device.

A fourth aspect of the present invention is the transfer system according to the first aspect of the present invention, wherein the to-be-molded material is an ultraviolet curable resin, and the positioning device bonds the mold and the substrate together by using part of the ultraviolet curable resin.

A fifth aspect of the present invention is the transfer system according to the first aspect of the present invention, wherein the to-be-molded material is a thermoplastic resin, the positioning device comprises heating means for heating the substrate and the mold, the substrate and the mold are heated by using the heating means of the positioning device up to a temperature equal to or lower than a temperature to soften and mold the thermoplastic resin, and the substrate is positioned relative to the mold after the heating, the transfer device comprises heating means for heating the substrate and the mold bonded together, and the thermoplastic resin is softened and the fine transfer pattern is transferred to the thermoplastic resin by using the heating means of the transfer device.

A sixth aspect of the present invention is a transfer system configured to transfer a fine transfer pattern formed in a mold to a substrate made of a thermoplastic resin, comprising: a positioning device configured to position the substrate relative to the mold and to bond the mold and the substrate together after the positioning; and a transfer device provided separately from the positioning device and configured to receive the mold and the substrate positioned and bonded together by the positioning device, and to press the mold and the substrate against each other thereby to perform the transfer, wherein the positioning device includes heating means for heating the substrate and the mold, the substrate and the mold are heated by using the heating means of the positioning device up to a temperature equal to or lower than a temperature to soften and mold the thermoplastic resin, and the substrate is positioned relative to the mold after the heating, the transfer device includes heating means for heating the substrate and the mold bonded together, and the substrate is softened and the fine transfer pattern is transferred to the substrate by using the heating means of the transfer device.

A seventh aspect of the present invention is the transfer system according to any one of the first, second, third, fifth and sixth aspects of the present invention, wherein the positioning device bonds the mold and the substrate together by using an ultraviolet curable resin.

An eighth aspect of the present invention is the transfer system according to any one of the first to seventh aspects of the present invention, wherein the transfer device performs the pressing by using a roller, and a region where the mold and the substrate are bonded together by the positioning device is located away from the roller in the transfer device.

A ninth aspect of the present invention is the transfer system according to any one of the first to seventh aspects of the present invention, wherein the transfer device performs the pressing by sandwiching the mold and the substrate between a roller and a mold-substrate holder, and a region where the mold and the substrate are bonded together by the positioning device is located away from the mold-substrate holder in the transfer device.

A tenth aspect of the present invention is the transfer system according to any one of the first to seventh aspects of the present invention, wherein the transfer device performs the pressing by sandwiching the mold and the substrate between a roller and a mold-substrate holder, and a region where the mold is bonded to the substrate by the positioning device is prevented from coming into contact with at least any one of the roller and the mold-substrate holder by at least any of a cutout portion formed in the roller and a cutout portion formed in the mold-substrate holder.

An eleventh aspect of the present invention is a transfer method of transferring a fine transfer pattern formed in a mold to a to-be-molded material provided on a substrate, comprising: a positioning step of positioning the substrate relative to the mold; a bonding step of bonding the mold and the substrate together after positioning in the positioning step; a delivering step of delivering the mold and the substrate bonded in the bonding step; and a transferring step of, after delivery in the delivering step, molding the to-be-molded material by pressing the bonded mold and substrate against each other to thereby perform the transfer.

Advantageous Effects of Invention

The present invention is effective in accurately positioning a substrate relative to a mold and reducing time required for transfer by increasing a pressure in the transfer.

DESCRIPTION OF EMBODIMENTS

Figure 6:
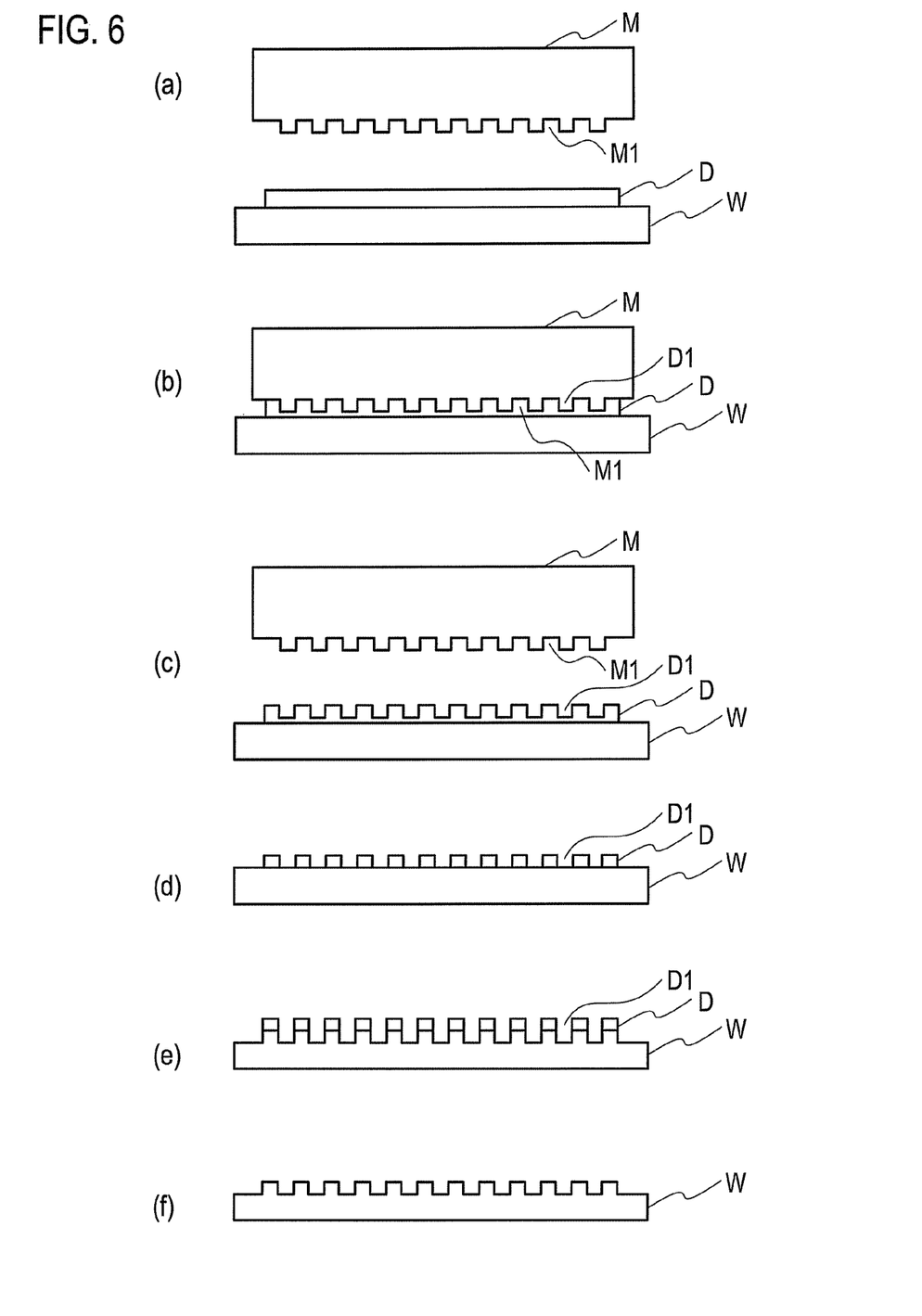
FIG. 6 is a view showing an outline of a transfer process.

As shown in FIG. 6, a transfer system 1 is configured to transfer a fine transfer pattern (a transfer pattern formed by fine indented pattern) M1 formed in a mold M to a to-be-molded material D provided on a substrate W. Fine indented pattern D1, which is inverted to the transfer pattern M1 in the mold M, are formed in the to-be-molded material D by this transfer process. The height and pitch of the fine indented pattern D1 (M1) is set approximately equivalent to a wavelength of visible light, for example.

Figure 1:
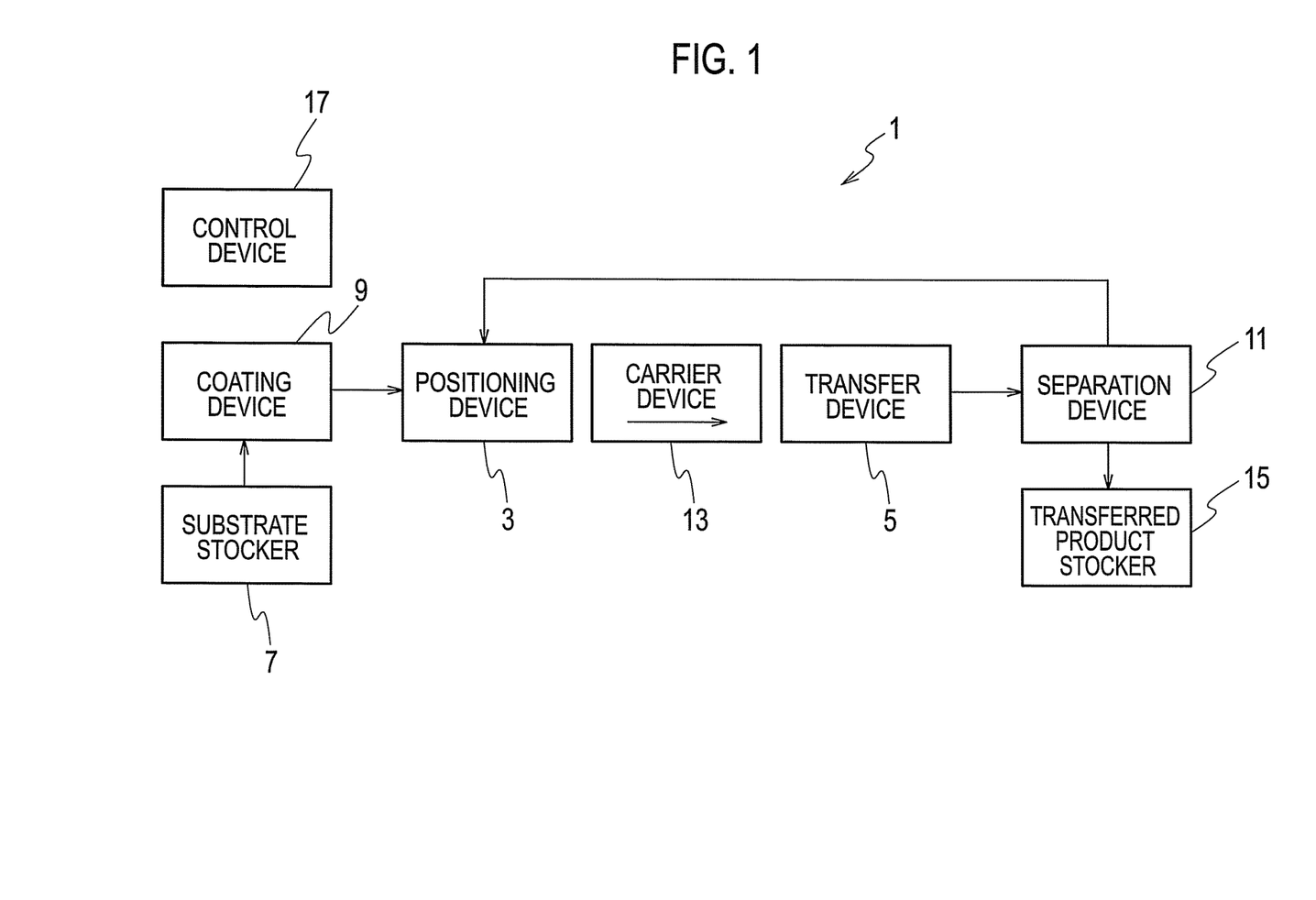
FIG. 1 is a block diagram showing an outline of a transfer system.

As shown in FIG. 1, the transfer system 1 includes a positioning device 3 and a transfer device 5. A substrate W stored in a substrate stocker 7 is delivered to a coating device 9, and the uncured to-be-molded material D is provided on the delivered substrate W by using the coating device 9. The substrate W provided with the to-be-molded material D is delivered (fed) to the positioning device 3. Here, the above-mentioned delivery of the substrate W is carried out by an unillustrated carrier device such as a robot.

As will be described later in detail, the substrate W is positioned relative to the mold M, and so forth by the positioning device 3. The mold M fed to the positioning device 3 is the mold M separated by a separation device (a device configured to separate the substrate W from the mold M, which are bonded together with the to-be-molded material D interposed in between, after the transfer process) 11. The mold M is fed from the separation device 11 to the positioning device 3 by an unillustrated carrier device such as a robot. If the mold M is made of a resin material or the like and is not used again, then a virgin mold M stored in an unillustrated mold stocker may be fed to the positioning device 3.

As will be described later in detail, the transfer device 5 is configured to transfer the transfer pattern M1, which is formed in the mold M, to the to-be-molded material D provided on the substrate W. A carrier device 13 for delivering the mold M and the substrate W (the to-be-molded material D) from the positioning device 3 to the transfer device 5 is also formed of a robot or the like.

The mold M, the substrate W, and the to-be-molded material D which are integrated together in the transfer process by the transfer device 5 (see FIG. 6(b)) are delivered to the separation device 11 where the mold M is detached from the substrate W and the to-be-molded material D (see FIG. 6(c)) The substrate W and the to-be-molded material D separated from the mold M are delivered to a transferred product stocker 15. The delivery of the substrate W and the like is also carried out by an unillustrated carrier device such as a robot.

Here, the delivery, positioning, transfer, and other processes on the substrate W, the mold M, and the like in the transfer system 1 are conducted by the sheet, for example, under control of a control device 17.

Figure 4:
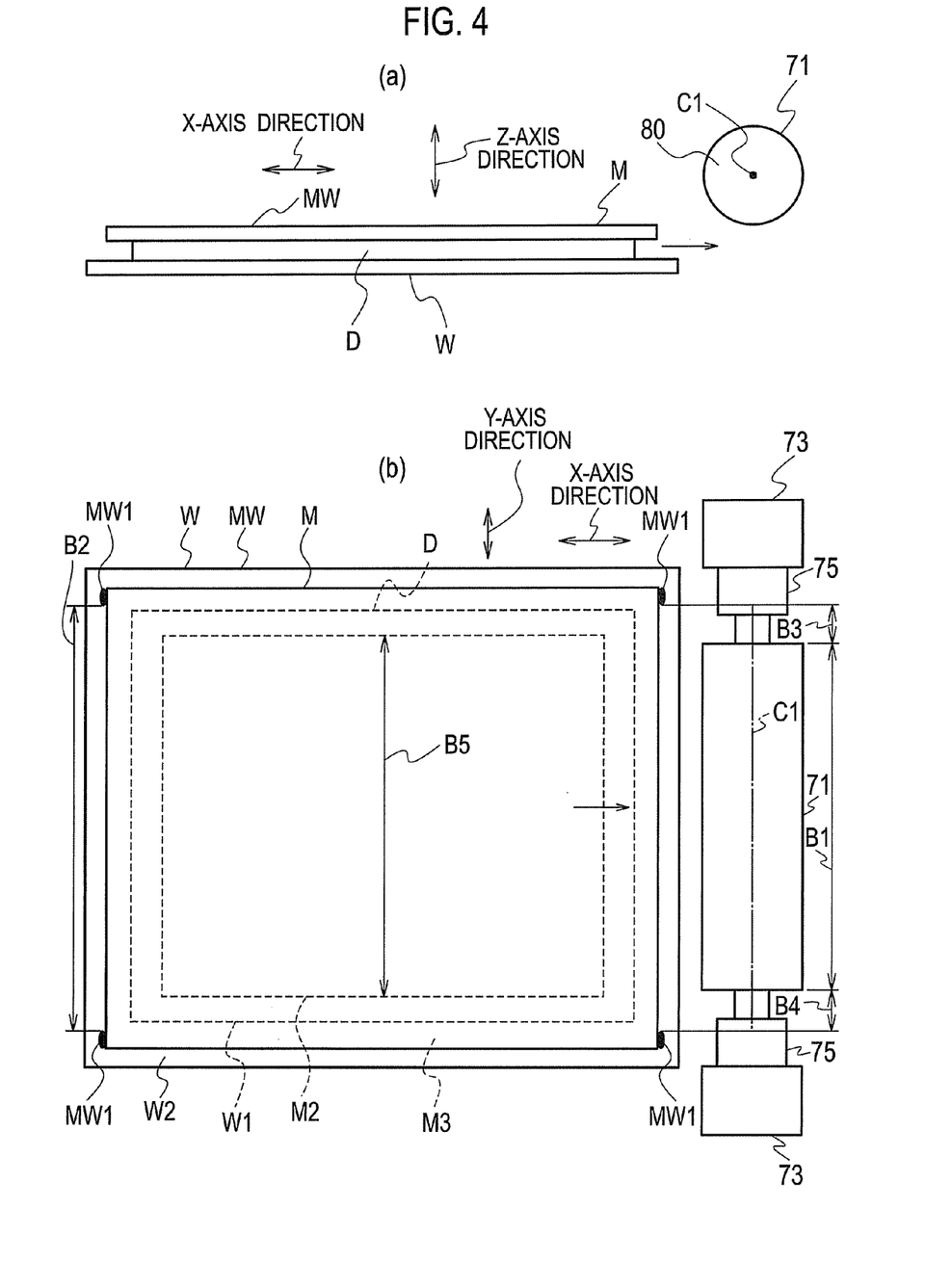
FIG. 4(a) is a front view and FIG. 4(b) is a plan view showing a schematic configuration of a mold-substrate bonded composite formed by bonding a mold and a substrate together with the positioning device and showing a position of a roller of the transfer device relative to the mold-substrate bonded composite.

The mold M is made of metal such as a nickel, an ultraviolet transmitting material such as fused silica, or a resin material, for example. Meanwhile, the mold M is formed into a shape of a rectangular flat plate as shown in FIG. 4 and FIG. 6, for example, and the fine transfer pattern M1 is formed on one surface in the thickness direction of the mold M. A region (transfer pattern formed region) M2 of the mold M where the fine transfer pattern M1 is provided is formed into a rectangular shape, for example, and is present at a central part of the mold M. Accordingly, a fine transfer pattern unformed region M3 in a hollow square shape is present at a peripheral part on the one surface in the thickness direction of the mold M.

The substrate W is made of a material which transmits an electromagnetic wave of a given wavelength (a material such as glass which transmits visible light) or a material such as silicon, and is formed into a shape of a rectangular flat plate, for example. The size of the substrate W is defined substantially the same as or slightly larger or smaller than the mold M.

The to-be-molded material D is made of a resin material such as a thermosetting resin or an ultraviolet curable resin (which may also be made of a material that transmits visible light). The to-be-molded material D is provided in the form of a thin film on one surface in the thickness direction of the substrate W. A region (a to-be-molded material provided region) W1 of the substrate W where the to-be-molded material D is provided is formed into a rectangular shape, for example, and is present at a central part of the substrate W. Accordingly, a to-be-molded material unprovided region W2 in a hollow square shape is present at a peripheral part on the one surface in the thickness direction of the substrate W. Here, the size of the to-be-molded material provided region W1 is defined substantially the same as or slightly larger or smaller than the transfer pattern formed region M2.

The to-be-molded material D is not cured before the transfer process and is in the form of a liquid or a fluid. The to-be-molded material D is cured and formed into a molded object when the to-be-molded material D undergoes the transfer process.

Figure 2:
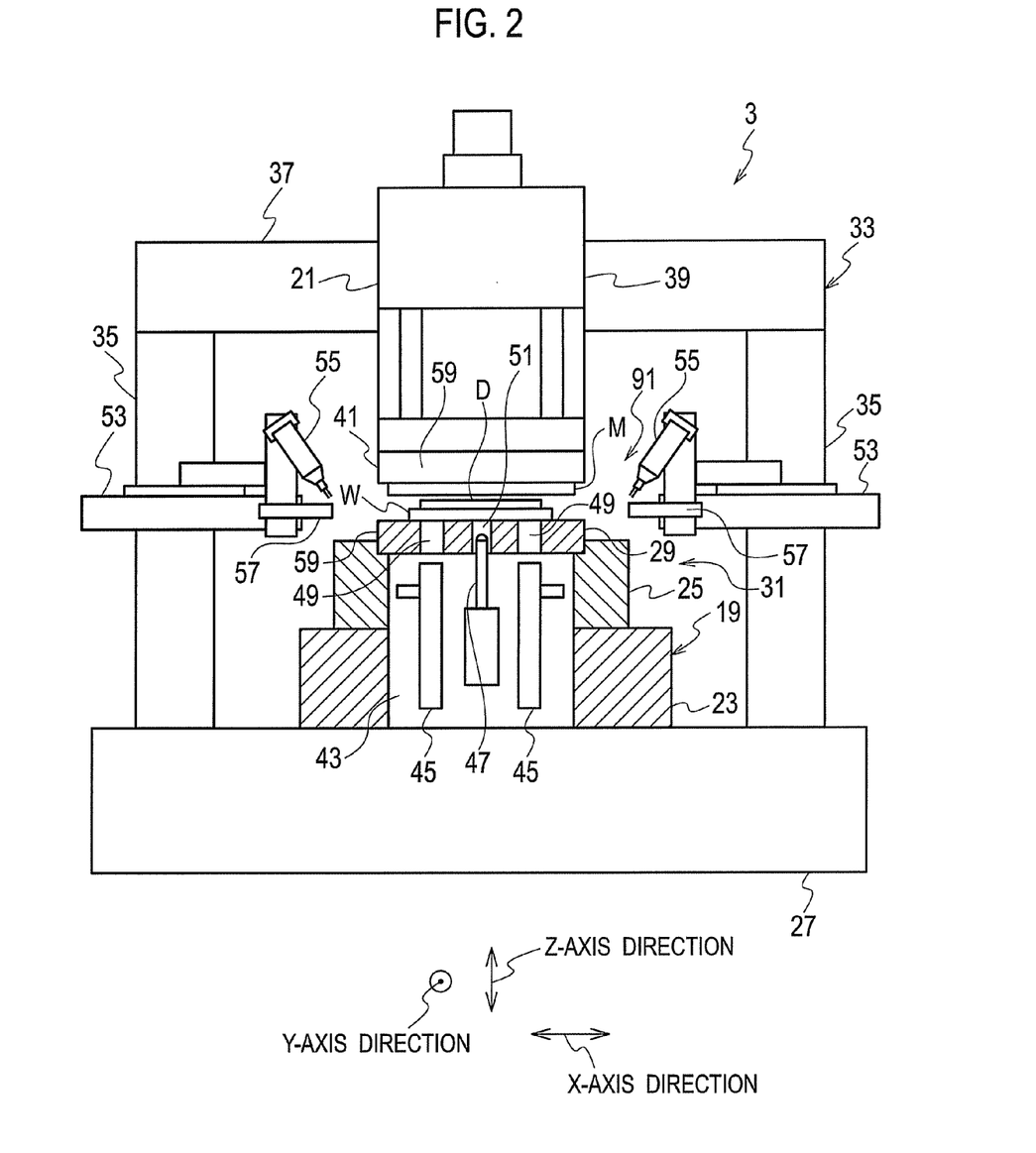
FIG. 2 is a view showing a schematic configuration of a positioning device.

The positioning device 3 is configured to position the substrate W relative to the mold M. In addition, the positioning device 3 is configured to bond the mold M (part of the mold M) and the substrate (part of the substrate provided with the to-be-molded material D) W to each other by using an adhesive, for example, and thereby to fix the position of the substrate W relative to the mold M and to integrate the mold M and the substrate W together.

Now, the positioning device 3 will be described in detail. In the following, one horizontal direction will be defined as an X-axis direction, another horizontal direction perpendicular to the X-axis direction will be defined as a Y-axis direction, and a vertical direction will be defined as a Z-axis direction for the convenience of the explanation.

As shown in FIG. 2, the positioning device 3 includes an XYθ stage 19 for locating the substrate W and a mold holder 21 for holding the mold M.

The XYθ stage 19 includes an XYθ stage base 23 and an XYθ stage table 25. The XYθ stage base 23 is provided integrally with a base body 27 at a central part on a flat upper surface of the base body 27. The XYθ stage table 25 is located above the XYθ stage base 23 and is guided by unillustrated guiding means (a guide unit; a guide mechanism) such as a bearing. Moreover, the XYθ stage table 25 can be freely moved (rotated) and positioned (rotating) relative to the XYθ stage base 23 in the X-axis direction, in the Y-axis direction, and around a θ-axis by appropriately driving unillustrated actuators such as servo motors under control of the control device 17. The θ-axis is an axis extending in the Z-axis direction and passing through the center of the XYθ stage 19, for example.

A substrate locator 29 in the shape of a flat plate is integrally provided in the center of a flat upper surface of the XYθ stage table 25. A flat upper surface of the substrate locator 29 spreads out horizontally. In addition, the substrate W is integrally held at a central part of the upper surface of the substrate locator 29 by using substrate holding means (a substrate holder; a substrate holding mechanism such as a vacuum holder) 31, which is capable of attaching and detaching the substrate W easily.

The substrate W is held on the substrate locator 29 in such a manner that the other surface in the thickness direction (the surface where the to-be-molded material D is not provided) thereof is located on a lower side and brought into surface contact with the upper surface of the substrate locator 29. Accordingly, the to-be-molded material D is present on the one surface (the upper surface spreading out in the horizontal direction) of the substrate W located on the substrate locator 29.

The mold holder 21 is supported by the base body 27 via a mold holder support 33. The mold holder support 33 includes supporting columns 35 and a horizontal beam 37. Here, a pair of supporting columns 35 are provided, for example. One of the supporting columns 35 is situated on one end side in the X-axis direction away from the XYθ stage 19, and is provided integrally with the base body 27 in such a manner as to stand upright from the upper surface of the base body 27. The other supporting column 35 is situated on the other end side in the X-axis direction away from the XYθ stage 19, and is provided integrally with the base body 27 in such a manner as to stand upright from the upper surface of the base body 27.

One end in a longitudinal direction of the horizontal beam 37 is integrated with an upper end of the one supporting column 35 while the other end in the longitudinal direction thereof is integrated with an upper end of the other supporting column 35. Hence, the mold holder support 33 is formed into a portal gate shape and the horizontal beam 37 extends lengthwise in the X-axis direction in a position above the XYθ stage 19 and away from the XYθ stage 19.

The mold holder 21 includes a mold holder body 39 and a mold holding unit (such as a vacuum chuck) 41. The mold holder body 39 is guided by unillustrated guiding means (a guide unit; a guide mechanism) such as a bearing. Moreover, the mold holder 21 is moved away from the XYθ stage 19 above the XYθ stage 19 and can be freely moved and positioned relative to the mold holder support 33 (the base body 27; the XYθ stage 19) in the Z-axis direction (in the direction to approach and to recede from the XYθ stage 19) by appropriately driving an unillustrated actuator such as a servo motor under control of the control device 17.

The vacuum chuck 41 is provided integrally with the mold holder body 39 at a lower end of the mold holder body 39. A lower surface of the vacuum chuck 41 spreads out in the horizontal direction. The other surface in the thickness direction of the mold M (the surface where the transfer pattern M1 is not formed) is brought into surface contact with a central part of the lower surface of the vacuum chuck 41, and the mold M is thus detachably attached by means of vacuum holding.

Here, when the substrate W in the state located on the substrate locator 29 of the XYθ stage 19 and the mold M in the state held by the mold holder 21 are viewed in the Z-axis direction, the center of the substrate W substantially coincides with the center of the mold M. Moreover, a longitudinal direction of the substrate W and a longitudinal direction of the mold M substantially coincide with the X-axis direction. Meanwhile, in the state where the substrate W is located on the substrate locator 29 of the XYθ stage 19 and the mold M is held by the mold holder 21, the mold M is situated above the substrate W. Then, the to-be-molded material D on the substrate W and the mold D come into contact with each other by moving the mold holder 21 in the Z-axis direction (downward) from the state in which the mold M is situated above the substrate W and away from the substrate W (the to-be-molded material D).

A cavity 43 is formed inside the XYθ stage 19. An upper side of the cavity 43 is covered with the substrate locator 29. Cameras 45 and a lift pin 47 are provided inside the cavity 43. The lift pin 47 is guided by unillustrated guiding means (a guide unit; a guide mechanism) such as a bearing, and is configured to move in the vertical direction by appropriately driving an unillustrated actuator such as a cylinder under control of the control device 17.

Each camera 45 can be freely moved and positioned in the X-axis direction and in the Y-axis direction, for example. Moreover, in the state positioned in terms of the X-axis direction and the Y-axis direction, the camera 45 can shoot the substrate W and the mold M through the substrate locator 29. The substrate W is made of a material such as glass, which can transmit visible light.

When the substrate locator 29 is made of metal or the like, then each camera 45 can shoot the substrate W and the mold M via a through-hole 49 provided on the substrate locator 29.

FIG. 1 depicts the configuration in which the mold M is shot through the to-be-molded material D when the mold M is viewed with each camera 45. However, in reality, the dimension in the X-axis direction of the to-be-molded material D is much smaller. Accordingly, there is no to-be-molded material D above the through-hole 49 so that the mold M can be shot without viewing through the to-be-molded material D when the mold M is shot with the camera 45.

Here, the substrate locator 29 is formed as thin as possible because the substrate locator 29 is not subjected to a pressure applied in the transfer process and is only required to be able to mount the substrate W.

At least a pair of cameras 45 are provided. One of the cameras 45 is provided on one side of the XYθ stage 19 and the other camera 45 is provided on the other side of the XYθ stage 19.

Moreover, an alignment mark (not shown) drawn, for example, on a corner of the substrate W and an alignment mark (not shown) drawn, for example, on a corner of the mold M are shot with each of the cameras 45. Then, the alignment mark on the mold M and the alignment mark on the substrate W are aligned with each other, for example, by appropriately moving the XYθ stage table 25 in response to a shooting result and under control of the control unit 17. Thus, it is possible to correct the position (the position in the X-axis direction, the Y-axis direction, and around the θ axis) of the substrate W located on the substrate locator 29 relative to the mold M held by the mold holder 21.

When the substrate W is made of a material such as silicon which does not transmit visible light, the alignment mark on the substrate W and the alignment mark on the mold M are individually shot by appropriately moving the cameras 45. Here, it is possible to provide two cameras for shooting the alignment mark on the substrate W and to provide two other cameras for shooting the alignment mark on the mold M. In the case of moving the two cameras 45 or the case of providing the four cameras 45 as described above, the cameras for shooting the alignment mark on the mold M are assumed to be capable of shooting the alignment mark on the mold M without viewing through the substrate W, by forming the substrate W smaller than the mold M, providing the substrate W with a through-hole, and so forth.

In the meantime, the cameras 45 may be provided on the mold holder body 39 instead of or in addition to providing the cameras 45 on the XYθ stage 19. Moreover, it is possible to shoot the alignment mark on the substrate W by using the cameras 45 provided on the XYθ stage 19 and to shoot the alignment mark on the mold M by using the cameras provided on the mold holder body 39.

When the lift pin 47 is placed on a lower end, the lift pin 47 is situated below the substrate W that is located on the substrate locator 29 and away from the substrate W. Meanwhile, when the lift pin 47 is placed on an upper end, an upper end portion of the lift pin 47 is designed to slightly protrude upward from the upper surface of the substrate locator 29 while penetrating a through-hole 51 provided in the center of the substrate locator 29. The substrate W located on the substrate locator 29 can easily be detached from the substrate locator 29 by causing the substrate locator 29 to stop vacuum holding and causing the lift pin 47 to protrude slightly upward from the upper surface of the substrate locator 29. Then, the substrate W is delivered by the carrier device 13.

Each supporting column 35 includes a dispenser support 53 placed away from the base body 27, the mold holder 21, the XYθ stage 19, and the horizontal beam 37. The dispenser support 53 is guided by unillustrated guiding means (a guide unit; a guide mechanism) such as a bearing. Moreover, the dispenser support 53 can be freely moved and positioned relative to the supporting column 35 (the XYθ stage base 23) in the X-axis direction and in the Y-axis direction by appropriately driving unillustrated actuators such as servo motors under control of the control device 17. Here, the dispenser support 53 may also be made to be freely movable in the Y-axis direction or freely rotatable around a given axis in addition to the movements in the X-axis direction and the Z-axis direction.

The dispenser support 53 is provided with a dispenser 55. The dispenser 55 is capable of ejecting a predetermined amount of an uncured adhesive (such as an ultraviolet curable resin) under control of the control unit 17.

In addition, the dispenser support 53 is provided with an adhesive curing promoter such as an LED (light-emitting diode) 57. When the adhesive to be ejected from the dispenser 55 is the uncured ultraviolet curable resin, the LED 57 is configured to emit ultraviolet rays.

Here, the LED 57 is not necessary when an instantaneous adhesive, a thermosetting resin or the like is used as the adhesive. Meanwhile, when a thermosetting resin is used as the adhesive, this thermosetting resin used as the adhesive is supposed to be cured at a lower temperature than a temperature for setting the thermosetting resin D, to which the transfer pattern M1 provided on the substrate W is transferred. Moreover, this thermosetting resin used as the adhesive is designed to be cured with a heater 59 of the positioning device 3 (whereas the latter thermosetting resin constituting the to-be-molded material D is designed not to be cured with the heater 59). Further, before the substrate W is positioned relative to the mold M, the thermosetting resin used as the adhesive is supposed to be prevented from being cured with the heater 59 of the positioning device 3.

Here, the to-be-molded material D and the adhesive (the adhesive for bonding the mold M and the substrate W together with the positioning device 3) may be of different types. For instance, the ultraviolet curable resin may be adopted as the adhesive irrespective of the type of the to-be-molded material D.

Figure 3:
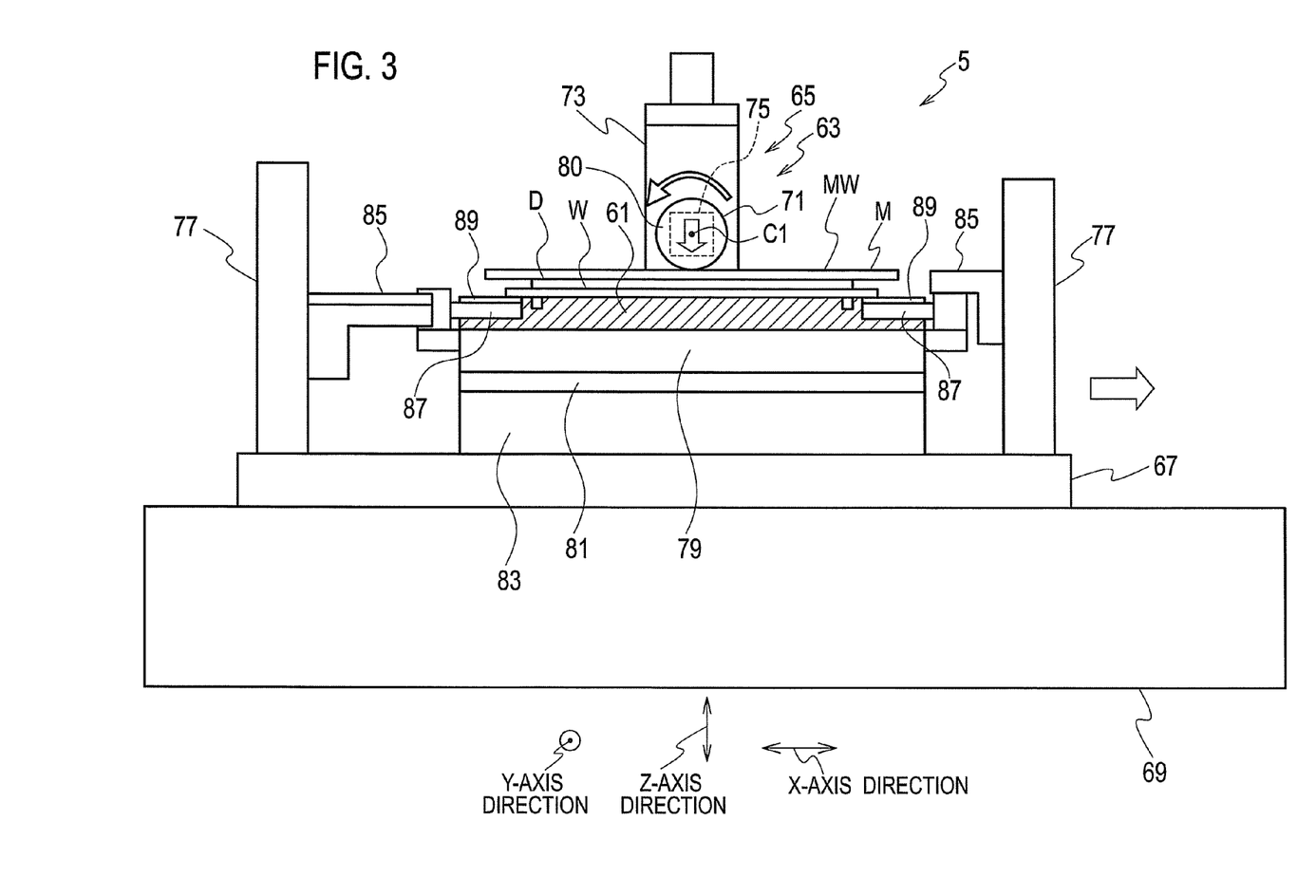
FIG. 3 is a view showing a schematic configuration of a transfer device.

The transfer device 5 is provided separately from the positioning device 3 and is located away from the positioning device 3. In addition, the transfer device 5 is configured to receive the mold M and the substrate W (a mold-substrate bonded composite MW), which are positioned and bonded together and integrated together by the positioning device 3, to press the mold M and the substrate W (to apply a sandwiching load to the mold M and the substrate W) to cure the to-be-molded material D, and thereby to achieve the transfer.

As shown in FIG. 3, the transfer device 5 includes a mold-substrate holder (such as a vacuum chuck) 61 configured to hold the mold-substrate bonded composite MW, pressing means (a pressing unit; a pressing mechanism) 63 for pressing the mold M and the substrate W, and to-be-molded material curing means (a to-be-molded material curing unit; a to-be-molded material curing device) 65 for curing the to-be-molded material D.

The vacuum chuck 61 is provided integrally with a table 67 on an upper side of the table 67. The table 67 is supported by a base body 69 on an upper side of the base body 69 via unillustrated guiding means (a guide unit; a guide mechanism) such as a bearing. Moreover, the table 67 can be freely moved and positioned relative to the base body 69 in the X-axis direction by appropriately driving an unillustrated actuator such as a servo motor under control of the control device 17.

The mold-substrate bonded composite MW is located integrally on a flat upper surface of the vacuum chuck 61 by means of vacuum holding. In the state where the mold-substrate bonded composite MW is located on the vacuum chuck 61, a surface of the substrate W (a lower surface; a surface on the opposite side to the to-be-molded material D and the mold M) of the mold-substrate bonded composite MW is in surface contact with the upper surface of the vacuum chuck 61. In addition, a longitudinal direction of the mold-substrate bonded composite MW coincides with the X-axis direction, and the mold-substrate bonded composite MW is present at a central part on the upper surface of the vacuum chuck 61.

The pressing means 63 includes a columnar or cylindrical roller 71. The roller 71 is supported by roller supporting columns 73 which are provided integrally with the base body 69. A rotation center shaft C1 of the roller 71 extends in the Y-axis direction.

A pair of roller supporting columns 73 are provided as shown in FIG. 4(b). One of the roller supporting columns 73 is situated on one end side in the y-axis direction away from the table 67 and the vacuum chuck 61, and is provided integrally with the base body 69 in such a manner as to stand upright from the base body 69. The other supporting column 73 is situated on the other end side in the Y-axis direction away from the table 67 and the vacuum chuck 61, and is provided integrally with the base body 69 in such a manner as to stand upright from the base body 69.

The roller 71 is supported by a pair of roller supports 75. Specifically, one end of the roller 71 in an extending direction of the shaft C1 is supported by one of the roller supports 75 via a bearing (not shown) while the other end of the roller 71 in the extending direction of the shaft C1 is supported by the other roller support 75 via a bearing (not shown).

The one roller support 75 is supported by the one roller supporting column 73 via unillustrated guiding means (a guide unit; a guide mechanism) such as a bearing. Moreover, the one roller support 75 can be freely moved and positioned relative to the one roller supporting column 73 in the Z-axis direction by appropriately driving an unillustrated actuator such as a servo motor under control of the control device 17.

The other roller support 75 is also supported by the other roller supporting column 73 via unillustrated guiding means (a guide unit; a guide mechanism) such as a bearing. Moreover, the other roller support 75 can be freely moved and positioned relative to the other roller supporting column 73 in the Z-axis direction synchronously with the one roller support 75 by appropriately driving an unillustrated actuator such as a servo motor under control of the control device 17.

Thus, the roller 71 moves vertically while maintaining the rotation center shaft C1 of the roller 71 in the horizontal state at any time (in such a manner as to extend in the Y-axis direction).

The roller 71 supported by the pair of roller supports 75 is located above the vacuum chuck 61 and away from the vacuum chuck 61. In addition, the roller 71 is configured to be detached from the mold-substrate bonded composite MW in a position above the mold-substrate bonded composite MW located on the vacuum chuck 61 when the pair of the roller supports 75 move upward. Meanwhile, the roller 71 is configured to come into contact with the mold-substrate bonded composite MW in a position above the mold-substrate bonded composite MW located on the vacuum chuck 61 when the pair of the roller supports 75 move downward, and to press (pinch) the mold-substrate bonded composite MW at an appropriate pressure in cooperation with the vacuum chuck 61.

When the roller 71 is pressing the mold-substrate bonded composite MW, a generating line of the roller 71 is in line contact with the mold M of the mold-substrate bonded composite MW.

Then, by moving the table 67, the roller 71 is rotated synchronously with a moving velocity of the table 67 (the roller 71 is rotated in such a manner that a circumferential velocity of the roller 71 and the moving velocity of the table 67 agree with each other). Thus, the to-be-molded material D (the mold-substrate bonded composite MW) is pressed from one end toward the other end in the X-axis direction (from the right to the left in FIG. 3) of the mold-substrate bonded composite MW.

As shown in FIG. 4(b), a length (a dimension in the Y-axis direction) of the roller 71 is made smaller than corresponding dimensions of the mold M and the substrate W, for example. Meanwhile, in the Y-axis direction, the center of the mold-substrate bonded composite MW and the center of the roller 71 coincide with each other. As a consequence, the roller is situated inside the mold-substrate bonded composite MW in the Y-axis direction.

It is to be noted, however, that the length (the dimension in the Y-axis direction) of the roller 71 may be smaller than the to-be-molded material provided region W1 and the transfer pattern formed region M2, substantially equal to the to-be-molded material provided region W1 and the transfer pattern formed region M2, or greater than the to-be-molded material provided region W1 and the transfer pattern formed region M2.

In the meantime, the to-be-molded material curing means 65 is configured to cure a region of the to-be-molded material D pressed by the roller 71. Accordingly, the to-be-molded material D is cured from one end toward the other end in the X-axis direction along with the movement of the mold-substrate bonded composite MW (the table 67) relative to the roller 71.

The table 67 is provided with a pair of supporting columns 77. One of the supporting columns 77 is situated on one end side in the X-axis direction away from the vacuum chuck 61 (a heater 79, a heat insulator 81, a cooling device 83) and is provided integrally with the table 67 in such a manner as to stand upright from an upper surface of the table 67. The other supporting column 77 is situated on the other end side in the X-axis direction away from the vacuum chuck 61 (the heater 79, the heat insulator 81, the cooling device 83) and is provided integrally with the table 67 in such a manner as to stand upright from an upper surface of the table 67.

The one supporting column 77 is provided with a lift pin support 85. The lift pin support 85 is guided by unillustrated guiding means (a guide unit; a guide mechanism) such as a bearing. Moreover, the lift pin support 85 can be freely moved and positioned relative to the supporting column 77 (the table 67) in the Z-axis direction by appropriately driving an unillustrated actuator such as a servo motor under control of the control device 17.

The other supporting column 77 is also provided with a lift pin support 85, which is configured to move synchronously with the lift pin support 85 of the one supporting column 77.

A lift pin 87 is provided integrally with each of the lift ping supports 85. Meanwhile, recesses 89 are provided at both ends in the X-axis direction of the upper surface of the vacuum chuck 61. When the lift pin supports 85 are situated at a descending end, the respective lift pins 87 enter the corresponding recesses 89.

The mold-substrate bonded composite MW can be located on the vacuum chuck 61 when the lift pins 87 enter the recesses 89. In the meantime, when the vacuum holding by the vacuum chuck 61 is stopped and the lift pins 87 (the lift pin supports 85) are lifted up, tip ends of the respective lift pins 87 and regions in the vicinities thereof come into contact with the lower surface (the lower surface at both ends in the X-axis direction) of the mold-substrate bonded composite MW. Hence, the lift pins 87 can lift up the mold-substrate bonded composite MW and easily detach the mold-substrate bonded composite MW from the vacuum chuck 61.

FIG. 3 depicts only one lift pin 87 on the right side and one lift pin 87 on the left side. However, at least three lift pins 87 are assumed to be provided in order to lift up the mold-substrate bonded composite MW stably. For example, there is one lift pin 87 on the right side in FIG. 3, which is provided at a central part in the Y-axis direction (the direction perpendicular to the sheet of FIG. 3) of the mold-substrate bonded composite MW. Meanwhile, there are two lift pins 87 on the left side in FIG. 3. One of the two lift pins 87 is provided on one end side (on a far side in FIG. 3 from the viewer) in the Y-axis direction of the mold-substrate bonded composite MW while another one of the two lift pins 87 is provided on the other end (on a near side relative in FIG. 3) in the Y-axis direction of the mold-substrate bonded composite MW.

Now, the transfer process in the case where the to-be-molded material D is made of a thermosetting resin will be described in detail.

In the transfer process in the case where the to-be-molded material D is made of the thermosetting resin, the uncured thermosetting resin D is provided on the upper surface of the substrate W in the form of a thin film in the first place as shown in FIG. 6(a). The mold M moves downward from the state where the mold M is detached from the upper surface of the substrate W (the thermosetting resin D).

Subsequently, the thermosetting resin D is pressed with the mold M and is heated. Thus, the thermosetting resin D is cured (see FIG. 6(b)).

Then, the mold M is lifted up and is separated from the substrate W as well as the thermosetting resin D (see FIG. 6(c)). Thus, the fine indented pattern (numerous fine recesses) D1 is formed in the thermosetting resin D.

Although the roller is not illustrated in the pressing process in FIG. 6, the pressing process is assumed to be performed by using the roller in reality. Nevertheless, the transfer device 5 may also be configured to perform pressing without the roller as illustrated in FIG. 6.

Next, the film remaining on the fine indented pattern D1 is removed by ashing such as $O_2$ ashing with a device provided separately from the transfer system 1 (see FIG. 6(d)). Then, the fine recesses are formed in the substrate W by a process such as etching while using the cured thermosetting resin D as a masking member (see FIG. 6(e)). When the cured thermosetting resin D is removed, the fine indented pattern is formed in the substrate W as shown in FIG. 6(f).

The thermosetting resin D is cured at a given temperature from about 200° C. to 250° C. (such as 250° C.). The mold M is made of metal such as nickel, and the substrate W is made of glass, for example.

When the to-be-molded material D is made of the thermosetting resin, the positioning device 3 includes heating means (a heating unit; a heating device) 91 (the heater 59) for heating the substrate (the substrate provided with the thermosetting resin D) W and the mold M located on the positioning device 3.

The heating means 91 of the positioning device 3 is assumed to be provided on the substrate locator 29 and the vacuum chuck 41. Specifically, the heating means 91 is assumed to be embedded in the vicinity of the upper surface of the substrate locator 29 and in the vicinity of the lower surface of the vacuum chuck 41, for example.

In this case, it is preferable to occlude the through-holes 49 in the substrate locator 29 for the cameras 45 with heat-resistant glass so that the cameras 45 are not adversely affected by the heat generated by the heater 59. In addition, it is also possible to provide a cooling device in the vicinity of the lower surface or on the lower surface of the substrate locator 29, or to provide cooling devices around the cameras 45 so that the cameras 45 are not adversely affected by the heat.

Moreover, when the to-be-molded material D is made of the thermosetting resin, the positioning device 3 uses the heating means 91 to heat the substrate W (the substrate W provided with the thermosetting resin D) and the mold M to a lower temperature (a slightly lower temperature, for example) than a temperature to cure the thermosetting resin D. Then, after the heating procedure, the positioning device 3 is configured to position the substrate W relative to the mold M while substantially keeping the heated temperature and to bond the mold M and the substrate W together.

In the meantime, when the to-be-molded material D is made of the thermosetting resin, the carrier device 13 is configured to deliver the mold-substrate bonded composite MW from the positioning device 3 to the transfer device 5 while substantially keeping the heated temperature by using heating means (a heating unit; a heating device). The heating means (the heating unit; the heating device) of the carrier device 13 is made of a heater installed in a substrate holder (not shown) of the carrier device 13, for example.

Although it is preferable to provide the carrier device 13 with the heating means, it is not always necessary to provide the carrier device 13 with the heating means if a delivery time is short and the temperature of the mold-substrate bonded composite MW is unlikely to drop very much due to the delivery.

Meanwhile, when the to-be-molded material D is made of the thermosetting resin, the transfer device 5 is provided with heating means (a heating unit; a heating device; such as a heater 80). Moreover, the substrate W and the mold M bonded together (the mold-substrate bonded composite MW located on the transfer device 5) are heated by the heater 80 so as to cure the thermosetting resin D.

The heater 79 of the transfer device 5 is formed into a rectangular flat shape and provided integrally with the vacuum chuck 61 in such a manner as to come into contact with the vacuum chuck 61 on a lower side of the vacuum chuck 61. The heat insulator 81 in a rectangular flat plate shape is provided integrally with the heater 79 in such a manner as to come into contact with a lower side of the heater 79. The cooling device 83 in a rectangular flat plate shape (such as a cooling device of a water-cooling type) 83 is provided integrally with the heat insulator 81 in such a manner as to come into contact with a lower side of the heat insulator 81. The cooling device 83 is provided integrally with the table 67 in such a manner that a lower surface of the cooling device 83 comes into contact with the upper surface of the table 67. In other words, the cooling device 83, the heat insulator 81, the heater 79, and the vacuum chuck 61 are stacked in this order and are integrally provided on the upper surface of the table 67.

The vacuum chuck 61 is made of a material such as metal having fine heat conductivity. The vacuum chuck 61 is made thicker and more rigid than the substrate locator 29 of the positioning device 3. Meanwhile, the vacuum chuck 61, the heater 79, the heat insulator 81, the cooling device 83, and the table 67 which are stacked together have sufficient rigidity for substantially eliminating deformation by the pressure from the roller 71 (such that a very little deformation, if any, does not adversely affect precision of the fine indented pattern D1 formed in the thermosetting resin D by the transfer process).

The heater 80 constituting the heating means (the heating unit; the heating device) of the transfer device 5 is provided inside the roller 71. Meanwhile, the thermosetting resin D is cured by the heat from the heater 80 of the roller 71. Here, the heater 79 of the vacuum chuck 61 is set to a temperature slightly lower than the temperature to cure the thermosetting resin D.

In the meantime, the heater 79 and the vacuum chuck 61 may be integrated together. Specifically, a heating element may be embedded in the vacuum chuck 61. In this case, it is preferable to place the heating element closest possible to the upper surface side of the vacuum chuck 61.

In this case, the upper surface of the vacuum chuck 61 (the surface to be heated by the heater 79; the surface formed into the rectangular flat shape) may be divided into multiple areas and each area may be configured to be capable of changing a temperature value (each area may be capable of changing the temperature independently).

Each area mentioned above is formed into an elongate rectangular shape. In addition, the areas are arranged in the X-axis direction in such a manner that the longitudinal direction thereof is aligned with the Y-axis direction while the width direction thereof is aligned with the X-axis direction.

Meanwhile, when the transfer device 5 performs the transfer process, the temperature in the areas of regions that sandwich the mold-substrate bonded composite MW in cooperation with the roller 71 (a region in a linear shape which is located immediately below the roller 71 in contact with the mold M of the mold-substrate bonded composite MW and regions in the vicinity thereof) may be increased to the temperature that can cure the thermosetting resin D under control of the control device 17. In this case, the heater 80 of the roller 71 may be omitted.

Here, the temperature at the other areas is set to a temperature slightly lower than the temperature to cure the thermosetting resin D. Thus, the thermosetting resin D before being pressed by the roller 71 is prevented from curing.

In the above description, the temperature only in the areas of the regions that sandwich the mold-substrate bonded composite MW in cooperation with the roller 71 is increased to the temperature that can cure the thermosetting resin D. Instead, the temperature in the area corresponding to a region which has been pressed by the roller 71 may be kept at the temperature that can cure the thermosetting resin D.

Meanwhile, if the roller 71 can complete pressing of the entire mold-substrate bonded composite MW in a short period of time, then the heater 79 of the vacuum chuck 61 may be omitted because the mold-substrate bonded composite MW would barely cool down.

In the meantime, the mold-substrate bonded composite MW is pressed in the transfer device 5 by using the roller 71 as described previously. Here, each region (a bonded portion MW1) where the mold M and the substrate W are bonded together with the positioning device 3 is located away from the roller 71 in the transfer device 5.

Since each bonded portion MW1 is located away from the roller 71, the pressure from the roller 71 is barely applied to the bonded portion MW1. Meanwhile, the bonded portion MW1 is prevented from destruction by the pressure from the roller 71. Moreover, it is possible to sufficiently press the thermosetting resin D and to achieve the transfer by the pressure from the roller 71 despite the presence of the solidified bonded portions MW1.

To explain this further in detail, as shown in FIG. 4(b), a width B1 of the roller 71 (a length dimension in the direction of the rotation center shaft C1 of the roller 71) is set smaller than an interval B2 between the bonded portions MW1 (the interval in the Y-axis direction). Moreover, the roller 71 is present in a space between the bonded portions MW1 in the Y-axis direction. There is an interval equivalent to a distance B3 between one of the bonded portions MW1 and the roller 71. Meanwhile, there is an interval equivalent to a distance B4, which is almost equal to the distance B3, for example, between the other bonded portion MW1 and the roller 71. When a width B5 of the transfer pattern formed region M2 is compared with the width B1 of the roller 71, the width B5 of the transfer pattern formed region M2 is substantially equal to the width B1 of the roller 71 or the width B1 of the roller 71 is greater, for example. Furthermore, in the Y-axis direction, the center of the transfer pattern formed region M2 coincides with the center of the roller 71.

Accordingly, when the mold-substrate bonded composite MW is pressed with the roller 71, the mold M and the substrate W are elastically deformed a little (elastically deformed to the extent that does not adversely affect the precision of the fine indented pattern D1). Thus, it is possible to apply the sufficient pressure for the transfer to the mold-substrate bonded composite MW (the to-be-molded material D) despite the presence of the bonded portions MW1.

Meanwhile, the transfer by the transfer device 5 (pressing by the transfer device 5) is achieved by sandwiching the mold M and the substrate W between the roller 71 and the mold-substrate holder 61 as described previously. Here, the region MW1 where the mold M and the substrate W are bonded together as well as the regions in the vicinity thereof may be located away from the mold-substrate holder 61.

For example, in FIG. 4(b), the width B1 of the roller 71 may be set greater than the interval B2 between the bonded regions MW1 so as to bring the roller 71 into contact with the bonded regions MW1 when the transfer device 5 presses the mold-substrate bonded composite MW. Meanwhile, the width of the mold-substrate holder 61 may be set smaller than the interval 82 between the bonded regions MW1 so as to prevent the bonded regions MW1 from being pressed between the roller 71 and the mold-substrate holder 61.

In addition, the regions MW1 where the mold M and the substrate W are bonded together and the regions in the vicinity thereof may be prevented from coming into contact with at least any one of the roller 71 and the mold-substrate holder 61 by providing at least any of cutout portions (ring-like small diameter portions) formed in the roller 71 and cutout portions (such as recesses similar to the recesses 89, or recesses that are shared with the recesses 89) formed in the mold-substrate holder 61. Specifically, the bonded region MW1 may be located away from at least any of the roller 71 and the mold-substrate holder 61 and may be prevented from being sandwiched between the roller 71 and the mold-substrate holder 61.

Figure 5:
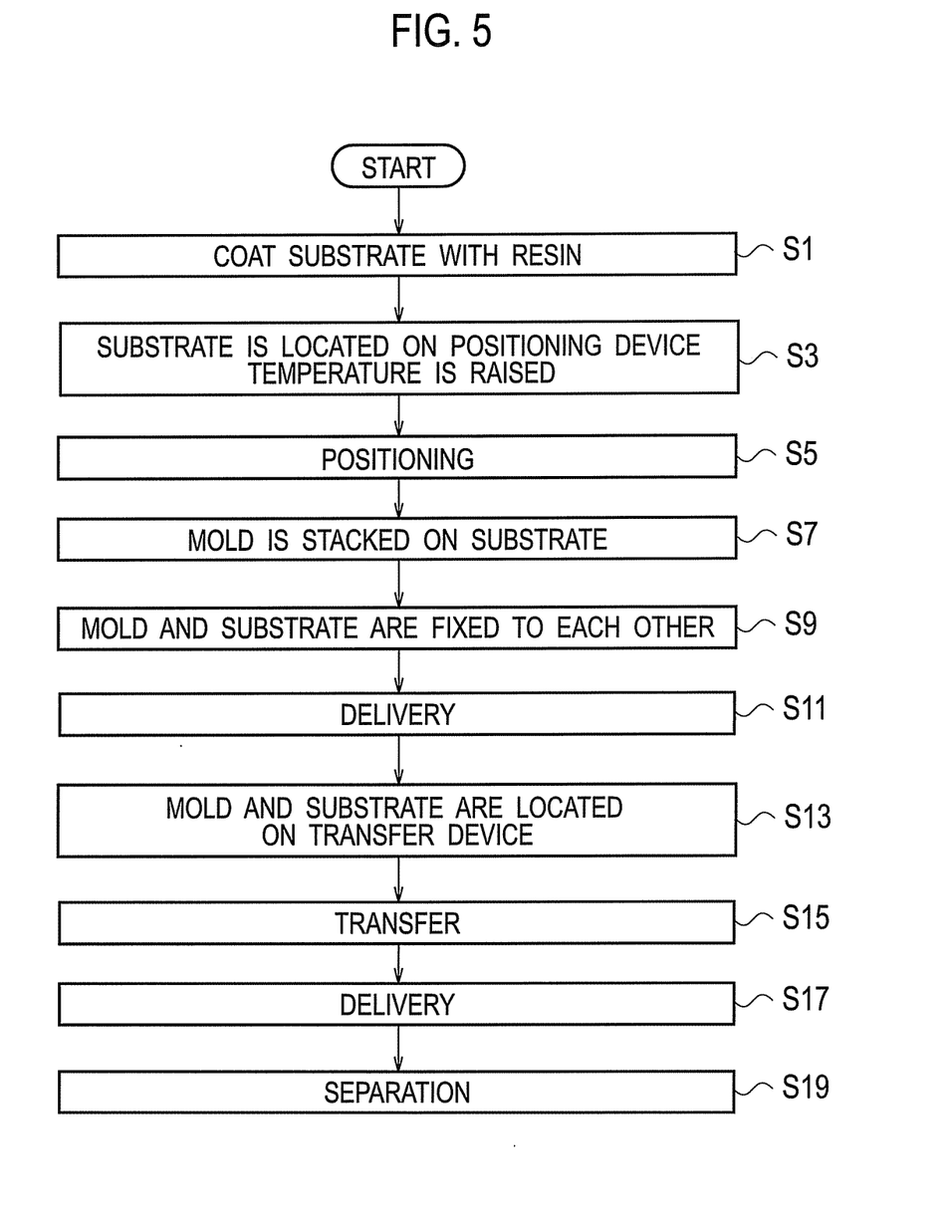
FIG. 5 is a view showing an outline of operations of the transfer system.

Now, operations of the transfer system 1 will be described with reference to FIG. 5.

First, the substrate W taken out of the substrate stocker 7 is provided with the thermosetting resin D by coating with the coating device 9, for example (S1). Here, the thickness of the thermosetting resin D is set in a range from several micrometers to several tens of micrometers, for instance.

Subsequently, the mold M and the substrate W provided with the thermosetting resin D are located on the positioning device 3, and the mold M and the substrate W provided with the thermosetting resin D are heated with the heater 59 (S3). By this heating process, the temperature of the mold M and the substrate W provided with the thermosetting resin D reaches the temperature close to the temperature to cure the thermosetting resin D. Here, the thermosetting resin is not cured yet.

Subsequently, the positioning device 3 positions the substrate W (the substrate W provided with the thermosetting resin D) relative to the mold M (S5).

Then, the mold holder 21 is moved downward to bring the mold M into contact with the thermosetting resin D, and the mold M is stacked on the substrate W (the substrate W provided with the thermosetting resin D) (S7).

Next, the mold M and the substrate W (the substrate W provided with the thermosetting resin D) are bonded together at the bonded regions MW1. Thus, the position of the substrate W relative to the mold M is fixed and the mold M and the substrate W are integrated together (S9).

Subsequently, the carrier device 13 delivers the mold and the substrate that are bonded together (the mold-substrate bonded composite MW) (S11).

Then, the transfer device 5 located in the position away from the positions used for the bonding (the bonded regions MW1) presses the mold-substrate bonded composite MW which is bonded and integrated together, thereby curing the thermosetting resin D and performing the transfer (S13, S15). Accordingly, the thermosetting resin D is cured and the fine transfer pattern M1 formed in the mold M is transferred to the to-be-molded material D.

Next, the mold-substrate bonded composite MW after the transfer process is taken out of the transfer device 5 (S17) and is delivered to the separation device 11.

Subsequently, the separation device 11 separates the mold M from the substrate W and the thermosetting resin D (S19). The substrate W and the thermosetting resin D separated from the mold M are delivered to and stored in the transferred product stocker 15.

Now, operations of the positioning device 3 will be described further in detail.

Here, the following conditions are premised in an initial state. Specifically, the mold holder 21 is holding the mold M. The substrate W provided with the uncured thermosetting resin D is located on the substrate locator 29. The thermosetting resin D on the substrate W is located away from the mold M by a predetermined slight distance. The dispensers 55 and the LEDs 57 are located away from the substrate W and the like each by a predetermined distance, and the lift pin 47 is moved down.

In the initial state, the heater 59 heats the mold M and the substrate W provided with the thermosetting resin D, and the cameras 45 shoot the alignment mark on the mold M and the alignment mark on the substrate W (ends of the mold M and the substrate W may be shot instead of the alignment marks). In this shooting operation, the mold M and the substrate W are preferably located closest possible to each other in the Z-axis direction. However, the thermosetting resin D is supposed to be located away from the mold M. Depending on a result of this shooting operation, the substrate W is positioned relative to the mold M by moving the XYθ stage table 25 as appropriate.

Subsequently, the mold holder 21 is moved downward to bring the mold M into contact with the thermosetting resin D on the substrate W. The pressure (the force of the mold M to press the substrate W and the thermosetting resin D) is barely generated in this state of contact. Here, the upper surface of the substrate W and the lower surface of the mold M are located parallel to and slightly away from each other. The thermosetting resin D is present between the substrate W and the mold M, and the thermosetting resin D enters the indented pattern of the fine transfer pattern M1 of the mold M without causing any voids therewith.

Here, the alignment mark on the mold M and the alignment mark on the substrate W may be shot with the cameras 45 and the substrate W may be positioned relative to the mold M after the mold holder 21 is moved downward and the mold M is completely brought into contact with the thermosetting resin D on the substrate W.

Then, the uncured ultraviolet curable resin is put (coated) on the substrate W and the mold M by moving the dispenser supports 53 as appropriate. The positions to put the ultraviolet resin on are located at the regions (dot-like regions each having a small size) MW1 near four corners of the mold M (or of the substrate W) as shown in FIG. 4(b), for example.

Next, the ultraviolet curable resin is cured by emitting ultraviolet rays from the LEDs 57. Thus, the mold M and the substrate W are integrated together. In this state, the thermosetting resin D is not cured yet. As shown in FIG. 4(b), since the bonded portions MW1 are formed into dots, it is easy to remove the bonded portions MW1 after the transfer process by the transfer device 5 (after the fine transfer pattern M1 in the mold M is transferred to the thermosetting resin D). Thus, the mold M can be separated easily from the substrate W and the thermosetting resin D.

Subsequently, the mold holder 21 stops holding the mold M and then the mold holder 21 is lifted up. Meanwhile, the substrate holding means 31 stops holding the substrate. The lift pin 47 is lifted up to detach the substrate W from the substrate locator 29. Then, the lift pin 47 is moved downward. The substrate W detached from the substrate locator 29 is delivered to the transfer device 5 by the carrier device 13.

Then, the next mold M and the next substrate W (the substrate W provided with the uncured thermosetting resin D) are located on the positioning device 3 to establish the initial state again.

Next, operations of the transfer device 5 will be described further in detail.

Here, the following conditions are premised in an initial state. Specifically, the table 67 is located on the other end side (on the left side as compared to the state illustrated in FIG. 3). The lift pins 87 are moved downward to enter the recesses 89 of the vacuum chuck 61. The mold-substrate bonded composite MW is located on the vacuum chuck 61 by vacuum holding. Meanwhile, the heater 79 keeps the mold-substrate bonded composite MW at the temperature slightly lower than the temperature to cure the thermosetting resin D, and the roller supports 75 are lifted up. In the initial state, the roller 71 is located above one end (an end on the right side in FIG. 3) of the mold-substrate bonded composite MW and away from the mold-substrate bonded composite MW.

In the initial state, the roller 71 is moved downward to press the mold-substrate bonded composite MW. While pressing, the roller 71 heats the mold-substrate bonded composite MW. At the same time, the table 67 is moved at a predetermined velocity (the table 67 is moved from the left end to the right end). Hence, the thermosetting resin D is cured to transfer the fine transfer pattern M1 to the thermosetting resin D.

Subsequently, the roller 71 is lifted up and the table 67 is moved back to the position in the initial state. Then, the vacuum chuck 61 stops vacuum holding of the mold-substrate bonded composite MW and the lift pins 87 are lifted up.

Then, the carrier device delivers the mold-substrate bonded composite MW to the separation device 11. The lift pins 87 are moved downward until the lift pins 87 enter the recesses 89. The next mold-substrate bonded composite MW is brought in with the carrier device 13 and located on the vacuum chuck 61 to establish the initial state again.

According to the transfer system 1, the positioning device 3 and the transfer device 5 are separately provided. After the substrate W is positioned relative to the mold M with the positioning device 3, the mold M and the substrate W are bonded together and are delivered to the transfer device 5 to undergo the transfer process. As a consequence, it is possible to perform the transfer process while maintaining the accurate position of the substrate W relative to the mold M, and to increase the pressure in the transfer. Thus, the accurate transfer can be achieved while reducing time required for the transfer.

Meanwhile, the substrate locator 29 provided on the XYθ stage table 25 can be formed thinner or the weight of the XYθ stage table 25 can be made smaller. Thus, the total weight of the substrate locator 29 and the XYθ stage table 25 can be made smaller. Accordingly, the XYθ stage table 25, the substrate locator 29, and the substrate W can be moved and positioned lightly and speedily.

In the transfer system 1, when the thermosetting resin is adopted as the to-be-molded material D, the positioning device 3 is also provided with the heating means 91 so that the transfer system 1 can perform the accurate transfer even when the substrate W and the mold M have different expansion coefficients associated with temperature variations.

Meanwhile, since the positioning device 3 is also provided with the heating means 91, the temperatures of the substrate W and the mold M barely change during a period from bonding the mold M and the substrate W together to performing the transfer. Thus, it is possible to avoid occurrence of a thermal stress on the substrate W and the mold M.

In addition, according to the transfer system 1, the regions MW1 where the mold M is bonded to the substrate W are located away from the roller 71 in the transfer device 5. Thus, the regions MW1 cured as a consequence of the bonding are not pressed (pressurized) by the heater 71. Accordingly, it is possible to apply a uniform pressure from the roller 71 to the mold-substrate bonded composite MW and thereby to achieve the accurate transfer.

Here, instead of the thermosetting resin, an ultraviolet curable resin may be used as the to-be-molded material D as described previously.

In this case, the positioning device 3 may be configured to bond the mold M and the substrate W (the substrate W provided with the ultraviolet curable resin D on which fine indented pattern D1 is to be formed by the transfer) together by using part of the ultraviolet curable resin D.

When the ultraviolet curable resin is adopted as the to-be-molded material D, the positioning device 3 does not require dispensers, for example; and can therefore be simplified. When the mold M and the substrate W (the substrate W provided with the uncured ultraviolet curable resin D) are located on the positioning device 3 and the mold M is brought into contact with the ultraviolet curable resin D, the ultraviolet resin D that slightly runs off the ends of the mold M and the substrate W is irradiated with the LEDs. Thus, the ultraviolet curable resin D slightly running off is cured so as to bond and integrate the mold M and the substrate W together.

As similar to the case of the thermosetting resin, portions of the ultraviolet curable resin D (the bonded portions MW1) to be cured for bonding the mold M and the substrate W together are located near the four corners of the mold M (or of the substrate W) as shown in FIG. 4(b).

In the meantime, the mold M is made of the ultraviolet transmitting material such as fused silica. The ultraviolet curable resin D, which is provided on the substrate W and has the transfer pattern M1 in the mold M transferred therein, is cured with an ultraviolet ray generation device (not shown) provided either inside the roller 71 made of the ultraviolet transmitting material or in the vicinity of the roller 71. The ultraviolet ray generation device is configured to emit ultraviolet rays onto the ultraviolet curable resin D in the linear region where the roller 71 presses the mold M, and in the vicinity of the linear region.

When the substrate locator 29 is made of glass and the substrate W is also made of glass, the ultraviolet ray generation device may be placed on a lower side of the substrate locator 29 or inside the substrate locator 29.

In addition, the dispensers may be provided as similar to the case of the thermosetting resin, and the substrate W and the mold M may be bonded together by using an adhesive ejected from the dispensers.

In the meantime, as has already been understood, the heating means (the heater; the heating device) 91 of the positioning device 3, the heater (the heating means; the heating device) 79 of the transfer device 5, and the heater (the heating means; the heating device) 80 of the transfer device 5 are configured to be able to perform temperature control on the basis of individual set values under the control of the control device 17 (configured to be able to perform temperature control independently of one another).

Although the to-be-molded material D is cured by using the transfer device 5 in the above description, a curing device for curing the to-be-molded material D may be separately provided between the transfer device 5 and the separation device 11 shown in FIG. 1 instead of curing the to-be-molded material D by using the transfer device 5. Hence, the to-be-molded material D may be cured by using the curing device.

Specifically, when the to-be-molded material D is the thermosetting resin, the transfer device 5 may only perform molding of the to-be-molded material D (molding by the pressure from the roller 71) while heating means (a heater; a heating device) of the curing device may cure the to-be-molded material. In this case, the heaters 79 and 80 of the transfer device 5 are configured to maintain the substrate W, the mold M, and the thermosetting resin D at a lower temperature (a temperature equal to that of the positioning device 3) than the temperature to cure the thermosetting resin D. Meanwhile, the heating means of the curing device is also configured to be able to perform temperature control independently of the other heating means 79, 80, and 91 under control of the control device 17.

In addition, the heating means of the curing device may be configured to lower the temperature of the to-be-molded material D gradually down to room temperature and to subject the molded and cured to-be-molded material D (with the fine transfer pattern M1 transferred thereto) to an annealing process.

In the meantime, when the to-be-molded material D is the ultraviolet curable resin, the transfer device 5 may only perform molding of the to-be-molded material D (molding by the pressure from the roller 71) while the ultraviolet ray generation device of the curing device may cure the to-be-molded material.

Meanwhile, a thermoplastic resin may also be used as the to-be-molded material D.

In this case, the substrate W and the mold M are heated to a temperature equal to or lower than a temperature to soften and mold the thermoplastic resin D by using the heating means 91 of the positioning device 3. After the heating process, the substrate W is positioned relative to the mold M.

Meanwhile, the thermoplastic resin D is softened by using the heating means 79 of the transfer device 5, and then the fine transfer pattern M1 is transferred to the thermoplastic resin D.

More specifically, the transfer device 5 softens the thermoplastic resin D by using the heating means 79, presses the softened thermoplastic resin D with the roller 71, and forms the fine indented pattern D1, which has inverted shapes relative to the transfer pattern M1 formed in the mold M, in the thermoplastic resin D. Thereafter, the thermoplastic resin D is cooled down to cure the thermoplastic resin D.

Here, the thermoplastic resin D located on the positioning device 3 and in the state before being heated by the heating means 91 of the positioning device 3 is assumed to be formed into a shape of a rectangular flat plate as similar to the mold M and the substrate W, for example, and to be integrated with or stacked as a separate body on the substrate W.

Meanwhile, cooling of the thermoplastic resin D is achieved by means of natural cooling by turning off switches for the heaters 79 and 80 of the transfer device 5. Here, a cooling device may be provided and the thermoplastic resin D may be cooled down by using the cooling device after the switches for the heaters are turned off. The thermoplastic resin D may be annealed as well.

Here, separation of the thermoplastic resin D (the substrate W) from the mold D is carried out after the thermoplastic resin D is cooled down and cured.

Although the transfer takes place on the to-be-molded material D that is provided on the substrate W in the above description, the transfer pattern M1 provided in the mold M may be transferred directly to the substrate W made of the thermosetting resin instead. In other words, the substrate W and the to-be-molded material D may be united.

Furthermore, the positioning device 3 and the transfer device 5 of the transfer system 1 may have the following configurations.

The positioning device 3 is configured to position the substrate W (the thermosetting resin D) relative to the mold M and to bond the mold M and the substrate W together after the positioning process.

The transfer device 5 is provided separately from the positioning device 3 and is configured to receive the mold M and the substrate W that are positioned and bonded together by the positioning device 3, and to perform the transfer by pressing the mold M and the substrate W.

The positioning device 3 includes the heating means 91 for heating the substrate W and the mold M, and is configured to heat the substrate W and the mold M to the temperature equal to or lower than the temperature to soften and mold the substrate W by using the heating means 91 of the positioning device 3, and to position the substrate W relative to the mold M after the heating process.

The transfer device 5 includes the heating means 79 for heating the substrate W and the mold M bonded together, and is configured to soften the substrate W and to transfer the fine transfer pattern M1 to the substrate W by using the heating means 79 of the transfer device 5.

REFERENCE SIGNS LIST 1 transfer system
3 positioning device
5 transfer device 71 roller
79, 91 heating means
D to-be-molded material (thermosetting resin, ultraviolet curable resin)
M mold
M1 transfer pattern
MW1 bonded region
W substrate

The invention claimed is:

1. A transfer system configured to transfer a fine transfer pattern formed in a mold to a to-be-molded material provided on a substrate, comprising:
 a positioning device configured to position the substrate relative to the mold and to bond the mold and the substrate together after the positioning; and
 a transfer device including a roller and a mold-substrate holder, the transfer device provided separately from the positioning device and configured to receive the mold and the substrate positioned and bonded together by the positioning device, and to mold the to-be-molded material by pressing the mold and the substrate against each other by sandwiching the mold and the substrate between the roller and the mold-substrate holder thereby to perform the transfer, wherein
 the positioning device includes one or more dispensers configured to eject an adhesive at least at two positions for the bonding to a side surface of the mold or of the substrate, the side surface being away from regions of the mold and the substrate to be pressed by the transfer device; and
 at least one of the roller and the mold-substrate holder has a width along a rotation axis of the roller, the width being smaller than an interval between the two positions of the adhesive.

2. The transfer system according to claim 1, wherein
 the positioning device comprises heating means for heating the substrate and the mold,
 the transfer device comprises heating means being different from the heating means of the positioning device, and
 the heating means of the positioning device and the heating means of the transfer device is temperature-controllable on the basis of individual set values.

3. The transfer system according to claim 1, wherein
 the to-be-molded material is a thermosetting resin,
 the positioning device comprises heating means for heating the substrate and the mold,
 the substrate and the mold are heated by using the heating means of the positioning device up to a temperature lower than a temperature to cure the thermosetting resin, and the substrate is positioned relative to the mold after the heating,
 the transfer device comprises heating means for heating the substrate and the mold bonded together, and
 the thermosetting resin is molded by using the heating means of the transfer device.

4. The transfer system according to claim 1, wherein
 the to-be-molded material is a thermoplastic resin,
 the positioning device comprises heating means for heating the substrate and the mold,
 the substrate and the mold are heated by using the heating means of the positioning device up to a temperature equal to or lower than a temperature to soften and mold the thermoplastic resin, and the substrate is positioned relative to the mold after the heating,
 the transfer device comprises heating means for heating the substrate and the mold bonded together, and
 the thermoplastic resin is softened and the fine transfer pattern is transferred to the thermoplastic resin by using the heating means of the transfer device.

5. The transfer system according to claim 1, wherein the positioning device is configured to perform the bonding by using any one of an ultraviolet curable resin, thermosetting resin, and an instantaneous adhesive as the adhesive.

6. The transfer system according to claim 1, wherein
 a region where the mold is bonded to the substrate by the positioning device is prevented from coming into contact with at least any one of the roller and the mold-substrate holder by at least any of a cutout portion formed in the roller and a cutout portion formed in the mold-substrate holder.

7. A transfer system configured to transfer a fine transfer pattern formed in a mold to a substrate made of a thermoplastic resin, comprising:
 a positioning device configured to position the substrate relative to the mold and to bond the mold and the substrate together after the positioning; and
 a transfer device including a roller and a mold-substrate holder, the transfer device provided separately from the positioning device and configured to receive the mold and the substrate positioned and bonded together by the positioning device, and to press the mold and the substrate against each other by sandwiching the mold and the substrate between the roller and the mold-substrate holder thereby to perform the transfer, wherein
 the positioning device includes heating means for heating the substrate and the mold,
 the substrate and the mold are heated by using the heating means of the positioning device up to a temperature equal to or lower than a temperature to soften and mold the thermoplastic resin, and the substrate is positioned relative to the mold after the heating,
 the positioning device includes one or more dispensers configured to eject an adhesive at least at two positions for the bonding to a side surface of the mold or of the substrate, the side surface being away from regions of the mold and the substrate to be pressed by the transfer device,
 at least one of the roller and the mold-substrate holder has a width along a rotation axis of the roller, the width being smaller than an interval between the two positions of the adhesive
 the transfer device includes heating means for heating the substrate and the mold bonded together, and
 the substrate is softened and the fine transfer pattern is transferred to the substrate by using the heating means of the transfer device.

8. The transfer system according to claim 7, wherein the positioning device is configured to perform the bonding by using any one of an ultraviolet curable resin, a thermosetting resin, and instantaneous adhesive as the adhesive.

9. The transfer system according to claim 7, wherein
 a region where the mold is bonded to the substrate by the positioning device is prevented from coming into contact with at least any one of the roller and the mold-substrate holder by at least any of a cutout portion formed in the roller and a cutout portion formed in the mold-substrate holder.

10. A transfer method of transferring a fine transfer pattern formed in a mold to a to-be-molded material provided on a substrate, comprising:
 a positioning step of positioning the substrate relative to the mold;

a bonding step of bonding the mold and the substrate together after positioning in the positioning step;

a delivering step of delivering the mold and the substrate bonded in the bonding step; and a transferring step of, after delivery in the delivering step, molding the to-be-molded material by pressing the bonded mold and substrate against each other to thereby perform the transfer, wherein the bonding step includes ejecting an adhesive for the bonding to a side surface of the mold or of the substrate, the side surface being away from regions of the mold and the substrate to be pressed in the transferring step, and the transferring step is performed while the adhesive is prevented from being pressed.

* * * * *